(12) United States Patent
Stolyarov et al.

(10) Patent No.: US 11,761,689 B1
(45) Date of Patent: Sep. 19, 2023

(54) METHOD AND SYSTEM FOR RECOVERING AND UTILIZING HEAT ENERGY PRODUCED BY COMPUTER HARDWARE IN BLOCKCHAIN MINING OPERATIONS

(71) Applicant: Graphene 3D Lab Inc., Ronkonkoma, NY (US)

(72) Inventors: Daniel Stolyarov, Middle Island, NY (US); Elena Polyakova, Middle Island, NY (US)

(73) Assignee: G6 MATERIALS CORP., Ronkonkoma, NY (US)

( * ) Notice: Subject to any disclaimer, the term of this patent is extended or adjusted under 35 U.S.C. 154(b) by 388 days.

(21) Appl. No.: 16/278,080

(22) Filed: Feb. 16, 2019

Related U.S. Application Data

(60) Provisional application No. 62/631,691, filed on Feb. 17, 2018.

(51) Int. Cl.
| | |
|---|---|
| *F25B 27/02* | (2006.01) |
| *H05K 7/20* | (2006.01) |
| *G06F 1/20* | (2006.01) |
| *F25B 15/00* | (2006.01) |
| *F25B 15/04* | (2006.01) |

(52) U.S. Cl.
CPC .............. *F25B 27/02* (2013.01); *F25B 15/002* (2013.01); *F25B 15/04* (2013.01); *G06F 1/20* (2013.01); *H05K 7/203* (2013.01); *H05K 7/2039* (2013.01)

(58) Field of Classification Search
CPC ........ F25B 27/02; F25B 15/002; H05K 7/203; H05K 7/2039; G06F 1/20
See application file for complete search history.

(56) References Cited

U.S. PATENT DOCUMENTS

| | | | | |
|---|---|---|---|---|
| 3,309,885 | A * | 3/1967 | Phillips et al. | C09K 5/047 62/112 |
| 7,394,655 | B1 * | 7/2008 | O'Keeffe | G06F 1/20 361/700 |
| 2014/0352351 | A1 * | 12/2014 | Xu | F25B 15/002 62/476 |

OTHER PUBLICATIONS

BBC: Russian nuclear scientists arrested for "Bitcoin mining plot" Feb. 9, 2018 <https://www.bbc.com/news/world-europe-43003740>.*
Peck, Morgan: "Why the Biggest Bitcoin Mines Are in China" Oct. 4, 2017 <https://spectrum.ieee.org/computing/networks/why-the-biggest-bitcoin-mines-are-in-china>.*

* cited by examiner

*Primary Examiner* — Tavia Sullens
(74) *Attorney, Agent, or Firm* — Mark R. Malek; Widerman Malek, PL

(57) ABSTRACT

A method for recovering heat (i.e., thermal) energy produced by computer hardware in blockchain (e.g., cryptocurrency) mining operations and utilizing that recovered heat energy in cooling modules. Also, a system for recovering heat energy produced by computer hardware in blockchain (e.g., cryptocurrency) mining operations and utilizing that recovered heat energy in absorption cooling modules which are an ammonia-water absorption refrigerator module and/or an absorption immersion cooling module.

22 Claims, 3 Drawing Sheets

METHOD AND SYSTEM FOR RECOVERING AND UTILIZING HEAT ENERGY PRODUCED BY COMPUTER HARDWARE IN BLOCKCHAIN MINING OPERATIONS

CROSS-REFERENCE TO RELATED APPLICATIONS

This application makes reference to and claims the priority benefit of the following co-pending U.S. Provisional Pat. Application No. 62/631,691, filed Feb. 18, 2018. The entire disclosure and contents of the foregoing Provisional Application is hereby incorporated by reference.

FIELD OF THE INVENTION

The present invention broadly relates to a method for recovering heat (i.e., thermal) energy produced by computer hardware in blockchain (e.g., cryptocurrency) mining operations and utilizing that recovered heat energy in absorption cooling modules which are an ammonia-water absorption refrigerator module and/or an absorption immersion cooling module. The present invention also broadly relates to a system for implementing this method.

BACKGROUND

Blockchain is an emerging technology of maintaining a public ledger in a decentralized computer network and is resistant to modification of records. It is often associated with cryptocurrencies (such as bitcoin) but can also be applied to recording transactions of various other categories (medical record, public records, etc.) in a verifiable and permanent way. Similarly, it may also be used for improving security for the "Internet of Things" (IoT) technologies.

The cornerstone of blockchain technology is the concept of the "proof-of-work" which relies on the heavy use of the computational power to add records to the ledger and hence, make it falsification-proof. Thus, by design, adding records to the blockchain ledger requires significant amounts of computational work. The computational work required to support a blockchain ledger (for example, for a bitcoin network) is known as "mining." Mining is currently performed by clusters of specialized computer hardware known as "mining farms." This computer hardware may include computer processing units (CPUs), commonly referred to as processors, graphic processing units (GPUs), field-programmable gate arrays (FPGAs), application-specific integrated circuits (ASICs), etc. One difference between GPUs and ASICs used in mining farms is that ASICs are much faster while GPUs are moderately flexible. ASICs are also more expensive and may be limited to a narrower set of functions. By contrast, GPU's perform operations by acting as accelerators for parallelworking algorithms.

SUMMARY

According to a first broad aspect of the present invention, there is provided a method for recovering heat energy from computer hardware in a blockchain mining operation, the method comprising the steps of:
(a) providing heat energy generated by computer hardware in a blockchain mining operation; and
(b) utilizing the heat energy in an absorption cooling module to generate a cooling effect with a coolant fluid comprising a fluid refrigerant-absorbent mixture, wherein the absorption cooling module comprises one or more of: an ammonia-water absorption refrigerator module; or an absorption immersion cooling module.

According to a second broad aspect of the present invention, there is provided a system for recovering heat energy from computer hardware in a blockchain mining operation, the system comprising:
a heat energy generation module comprising one or more blockchain mining operations having computer hardware which generate heat energy; and
an absorption cooling module which utilizes the heat energy from the heat energy generation module to generate a cooling effect with a coolant fluid comprising a fluid refrigerant-absorbent mixture, wherein the absorption cooling module comprises one or more of: an ammonia-water absorption refrigerator module; or an absorption immersion cooling module.

BRIEF DESCRIPTION OF THE DRAWINGS

The invention will be described in conjunction with the accompanying drawings, in which.

DETAILED DESCRIPTION

Figure 1:
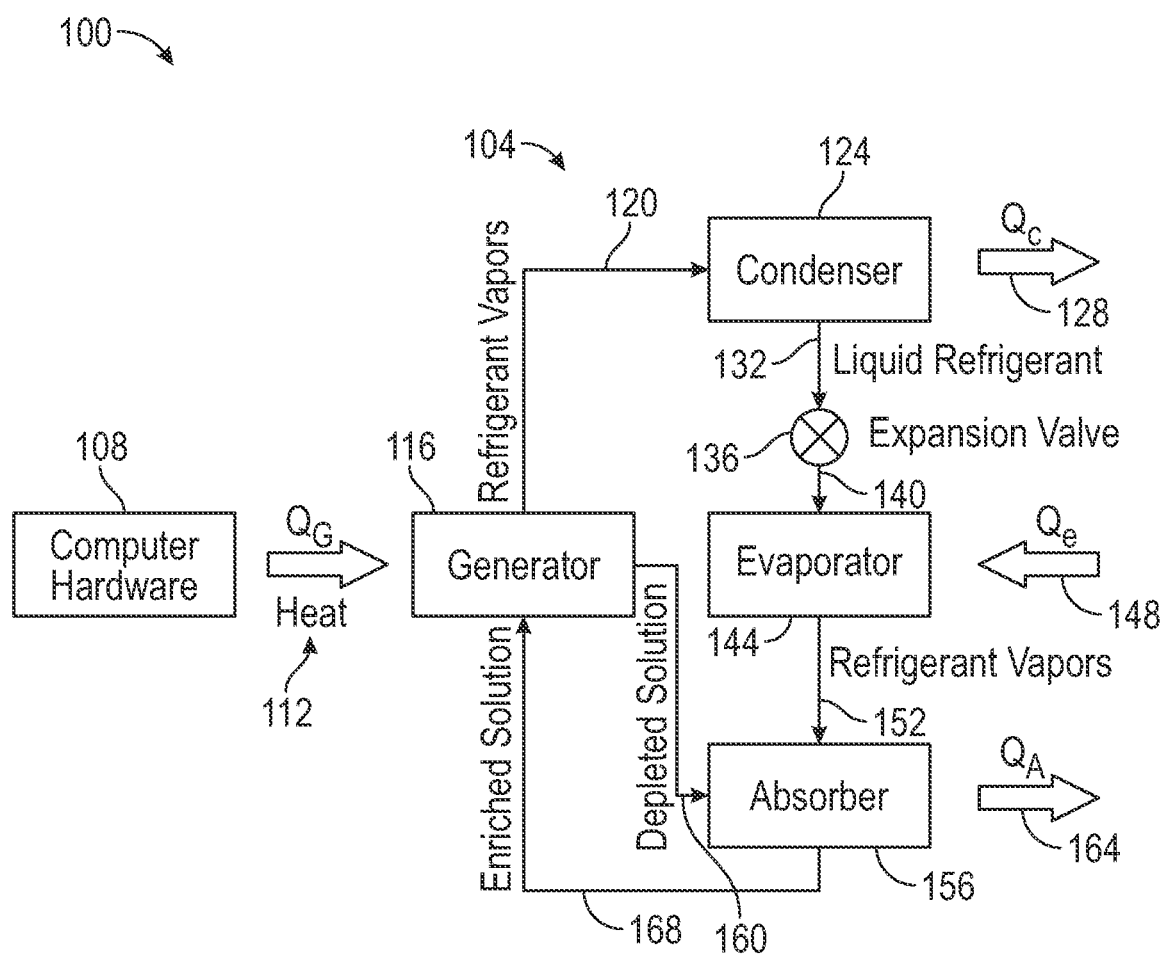
FIG. 1 schematically illustrates generally the absorption cooling module used in embodiments of the method and system of the present invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "central processing unit" (used interchangeably with the term "CPU") refers generally to the electronic circuitry within a computer that carries out the instructions of a computer program by performing the basic arithmetic, logical, control and input/output (I/O) operations specified by the instructions. The term "CPU" often refers to a processor, more specifically to its processing unit and control unit (CU), distinguishing these core elements of a computer from external components such as main memory and I/O circuitry.

For the purposes of the present invention, the term "graphics processing unit" (used interchangeably with the term "GPU") refers generally to a specialized electronic circuit designed to rapidly manipulate and alter memory to accelerate the creation of images in a frame buffer intended for output to a display device, and which may also be used for other purposes, operations, etc., (for example, in a blockchain operation).

For the purposes of the present invention, the term "field-programmable gate array" (used interchangeably with the term "FPGA") generally refers to an integrated circuit designed to be configured by a customer or a designer after manufacturing - hence the reference to "field-programmable." An FPGA configuration is generally specified using a hardware description language (HDL), similar to that used for an application-specific integrated circuit (ASIC).

For the purposes of the present invention, the term "application-specific integrated circuit" (used interchangeably with the term "ASIC") generally refers to an integrated circuit (IC) customized for a particular use, rather than intended for a general-purpose use.

For the purposes of the present invention, the term "blockchain" (also known interchangeably as "block chain") generally refers to a continuously growing list of records, called "blocks," which are linked and secured using cryptography to form a distributed ledger. Each block typically contains a cryptographic hash of the previous block, a timestamp and a transaction data. By design, blockchain is inherently resistant to modification of the data. It may function as an open, distributed ledger that can record transactions between two parties efficiently and in a verifiable and permanent way. For use as a distributed ledger, a blockchain is typically managed by a peer-to-peer network collectively adhering to a protocol for validating new blocks. Each succeeding block comprises a hash, a unique digital fingerprint, of the preceding one. Once recorded, the data in any given block cannot be altered retroactively without the alteration of all subsequent blocks.

For the purposes of the present invention, the term "cryptocurrency" generally refers to a digital asset (also referred to as a "digital currency," "alternate currency," "virtual currency," etc.) designed to work as a medium of exchange that uses cryptography to secure its transactions, to control the creation of additional units, and to verify the transfer of assets.

For the purposes of the present invention, the term "bitcoin" generally refers to a cryptocurrency and worldwide payment system involving decentralized digital currency using a peer-to-peer network ("bitcoin network") where transactions take place between users directly and without an intermediary. These transactions are verified by network nodes through the use of cryptography and recorded in a public distributed ledger such as blockchain.

For the purposes of the present invention, the term "bitcoin network" generally refers to a peer-to-peer payment network that operates on a cryptographic protocol involving bitcoins. Users send and receive bitcoins, the units of currency, by, for example, broadcasting digitally signed messages to the network using bitcoin cryptocurrency wallet software. Transactions are recorded into a distributed, replicated public database such as blockchain, with consensus achieved by a proof-of-work system such as mining.

For the purposes of the present invention, the term "mining" generally refers to the computational work performed in a proof-of-work system to support a cryptocurrency "peer-to-peer" network such as blockchain or a bitcoin network.

For the purposes of the present invention, the term "mining farm" refers to one or more clusters of specialized computer hardware used to carry out mining.

For the purposes of the present invention, the term "computer hardware" refers to the physical components of a computer, such as the monitor, keyboard, computer data storage, graphic card, sound card, motherboard, heat sinks, etc.

For the purposes of the present invention, the term "components of computer hardware" refers to those components of the computer hardware that generate heat energy or are involved in conducting heat energy, such as the central processing unit (CPU); circuit boards, such as printed circuit boards (also known interchangeably as "PCBs"); chipsets; memory chips such as random-access memory (e.g., RAM, SRAM, DRAM, etc.), read-only memory (ROM, etc); buses; graphic cards; video cards; data storage disks, such as hard disks; etc.

For the purposes of the present invention, the term "coolant fluid" refers to a composition, mixture, suspension, solution, etc., which is fluid (e.g., liquid), can extract, remove, conduct, absorb, etc., heat energy, and can then release the extracted, removed, conducted, absorbed, etc., heat energy to cause, impart, etc., a cooling effect. Suitable coolant fluids for use herein are dielectric, and have a boiling or vaporization temperature within the range of normal operating temperatures of computer hardware used in a blockchain mining operation.

For the purposes of the present invention, the term "absorption cooling module" refers to a cooling module which employs a coolant fluid in the form of a fluid refrigerant-absorbent mixture. An absorption cooling module typically employs a combination of three phases: (1) an evaporation phase wherein the gaseous or liquid refrigerant evaporates (vaporizes) due to extracting heat from its surrounding lower pressure environment and producing, imparting, causing, etc., a cooling effect; (2) an absorption phase wherein the vaporized (gaseous) refrigerant from the evaporation phase is absorbed by an absorbent solution containing an absorbent (e.g., a refrigerant-depleted absorbent solution from the regeneration phase) to form an refrigerant-enriched absorbent solution; and (3) a regeneration phase wherein the refrigerant-enriched absorbent solution from the absorbent phase is again heated (e.g., in a generator) to vaporize the refrigerant from the absorbent solution (thus forming a refrigerant-depleted absorbent solution), the vaporized refrigerant from the generator passing through a heat exchanger (e.g., a condenser) to condense the refrigerant into a liquid form (to be returned to supply refrigerant for the evaporation phase) and thus release (transfer) heat energy from the refrigerant to outside the absorption cooling module. See description of FIG. 1 below of absorption cooling module 100.

For the purposes of the present invention, the term "absorption refrigerator" refers to a refrigerator used in an absorption cooling module which uses heat energy to the drive the cooling process.

For the purposes of the present invention, the term "refrigerant-absorbent mixture" (also referred to interchangeably as the "working fluid") refers to a coolant fluid which comprises one or more refrigerants and one or more absorbents which may be used in embodiments of the absorption cooling modules according to the present invention. The refrigerant-absorbent mixture may be, for example, a homogeneous liquid, a colloidal suspension (e.g., a suspension of absorbent particles in a liquid refrigerant), etc.

For the purposes of the present invention, the term "absorption immersion cooling module" refers to an absorption cooling module wherein at least some of the components of the computer hardware that generate heat energy are immersed in a fluid refrigerant-absorbent mixture.

For the purposes of the present invention, the term "refrigerant" refers to a composition, compound, substance, mixture, etc., which undergoes phase transitions from liquid to gas and back again from gas to liquid. Refrigerants suitable for use herein have boiling points of, for example, about 135° C. or less, such as in the range of from about -35° to about 130° C., and may include one or more of: dielectric fluorocarbons (e.g., may have at least 3 carbon atoms, such as from 3 to 12 carbon atoms, may have an alkane or ether backbone, may have alkoxy groups, may have fluoroalkyl groups, may have at least 5 fluoro groups, such as from 5 to 16 fluoro groups, etc.), including dielectric chlorofluorocarbons (e.g., Freon type), many of the fluorocarbons being sold/distributed by 3M under the Novec tradename; ammonia, etc. Suitable dielectric fluorocarbons for use herein as refrigerants may have boiling points in the range of, for example, from about 15° to about 130° C., and may include one or more of: 1,1,1,3,3-pentafluoropropane (known as R-245fa); 1-methoxyheptafluoropropane (known as Novec 7000); perfluoro(2-methyl-3-pentanone) (known as Novec 649 or Novec 1230); nonafluoromethoxybutane (known as Novec 7100); 1,1,1,2,2,3,4,5,5,5-decafluoro-3-methoxy-4-(trifluoromethyl)pentane (known as Novec 7300); 2-(trifluoromethyl)-3-ethoxydodecafluorohexane (known as Novec 7500); etc.

For the purposes of the present invention, the term "absorbent" refers to a composition, compound, substance, mixture, etc., which, when mixed with a refrigerant to form a refrigerant solution, elevates the boiling (volatilization) temperature of refrigerant present in the mixture as compared to the refrigerant alone. For ammonia-water absorption cooling modules wherein ammonia is the refrigerant, water may be used as the absorbent. For absorption immersion cooling modules wherein one or more fluorocarbons are used as the refrigerant, the absorbents may include one or more of: fluoride salts (such as cesium fluoride); lithium bromide; N,N-dimethylacetamide (DMCA); N-methyl-2-pyrrolidone (NMP); dimethyl-ethylene urea (DMEU); tetraethylene glycol dimethyl ether (TEGDME); N-methyl ε-caprolactum (MCL); functionalized graphene oxide nanoplatelets; etc.

For the purposes of the present invention, the term "capping gas" refers to an inert gas such hydrogen, helium, argon, neon, nitrogen, etc., which is not miscible with the refrigerant and which allows for equalization of the pressure in a absorption refrigerator module, thus avoiding the need to use an expansion valve for that purpose.

For the purposes of the present invention, the term "graphene" refers to pure or relatively pure carbon in the form of a relatively thin, nearly transparent sheet, which is one atom in thickness (i.e., a monolayer sheet of carbon), or comprising multiple layers (multilayer carbon sheets), having a plurality of interconnected hexagonal cells of carbon atoms most of which are present in $sp^2$ hybridized state and which form a honeycomb like crystalline lattice structure. In addition to hexagonal cells, pentagonal and heptagonal cells (defects), versus hexagonal cells, may also be present in this crystal lattice.

For the purposes of the present invention, the term "graphene oxide" (also known as "graphitic acid" and "graphite oxide") refers interchangeably to a compound of carbon, oxygen, and hydrogen which may exist in variable ratios of these three atoms, and which may be obtained by treating graphite with strong oxidizers.

For the purposes of the present invention, the term "functionalized graphene" refers to graphene which has incorporated into the graphene lattice a variety chemical functional groups such as —OH, —COOH, —NH$_2$, alkyl groups, etc., in order to modify the properties of graphene.

For the purposes of the present invention, the term "partially reduced graphene oxide" refers to graphene oxide that, upon reduction, contains from about 5 about 30% oxygen by weight of the graphene oxide.

For the purposes of the present invention, the term "graphene nanoplatelets (NGPs)" and "nanosheets" refer interchangeably to platelets of graphene, and may also refer to platelets and sheets comprised of other graphene-like materials such as graphene oxide, partially reduced graphene oxide, functionalized graphene, etc., having a thickness in the range of from about 0.34 to about 100 nm and may include one material or in any combination.

For the purposes of the present invention, the term "fluid" refers to a composition, compound, substance, material, etc., which may be in either a liquid or gaseous state at the temperature of use (e.g., room temperature).

For the purposes of the present invention, the term "liquid" refers to a non-gaseous fluid composition, compound, substance, material, etc., which may be readily flowable at the temperature of use (e.g., room temperature) with little or no tendency to disperse and with a relatively high compressibility.

For the purposes of the present invention, the term "solid" refers to non-volatile, non-liquid components, compounds, materials, etc., which may be in the form of, for example, particulates, particles, powders, etc.

For the purposes of the present invention, the term "room temperature" refers to refers to the commonly accepted meaning of room temperature, i.e., an ambient temperature of from about 20° to about 25° C.

For the purposes of the present invention, the term "comprising" means various compositions, compounds, components, elements, steps, etc., may be conjointly employed in embodiments of the present invention. Accordingly, the term "comprising" encompasses the more restrictive terms "consisting essentially of" and "consisting of."

For the purposes of the present invention, the terms "a" and "an" and similar phrases are to be interpreted as "at least one" and "one or more." References to "an" embodiment in this disclosure are not necessarily to the same embodiment.

For the purposes of the present invention, the term "and/or" means that one or more of the various compositions, compounds, components, elements, steps, etc., may be employed in embodiments of the present invention.

Unless otherwise specified, all percentages given herein are by weight.

Description

Blockchain technologies and related cryptocurrency mining operations involved in bitcoin networks rely heavily on computational work which consumes primarily electrical power. In performing a significant amount of computational work, mining farms by necessity consume a substantial amount of electrical power. As blockchain technologies and related cryptocurrency mining operations become more prevalent, the total amount of electric power consumed worldwide will likewise grow rapidly. Due to this significant consumption of electrical power by mining operations, especially mining farms, the blockchain and related cryptocurrency mining industries are becoming one of the largest consumers of electrical power, on par with other large energy consuming industries such as aluminum production.

The components in computer devices (collectively, the computer hardware) which may used for such mining, including computer processing units (CPUs), graphical processing unit (GPUs), field-programmable gate arrays (FPGAs), etc., as well as stand-alone computer devices such as application-specific integrated circuits (ASICs), etc., require electrical power to function. This computer hardware used in such mining operations may consume substantial amounts of electric power. Thus, the cost of the electric power consumed in such mining operations may become a substantial portion of the final cryptocurrency price.

A significant by-product of such electrical power consumption by such computer hardware used in mining operations is thermal energy (heat). The heat energy generated by the computer hardware used such mining operations is currently simply dissipated in the surrounding environment and lost. But given the substantial consumption of electrical power by such computer hardware in these mining operations, the total cost of such electrical power consumed, and its potential impact on the cost of on the desired end-product obtained during such mining operations (e.g., cryptocurrency), saving or recovering the value of the by-product of such electrical power consumption, namely heat energy, generated by the computer hardware in such mining operations is becoming increasingly important.

As blockchain technologies and related cryptocurrency mining operations involved in bitcoin networks further develop and improve, this specialized computer hardware used for the mining operation will likely become more and more efficient, but is unlikely to solve all of the electrical energy consumption problems, including heat energy generation of the mining operation. The mining operation is governed in such a way that regardless of the efficiency of the computer hardware network supporting the blockchain, the overall system also is likely to automatically adjust the difficulty level of the problems need to be solved in order to add another record to the blockchain ledger so that it covers approximately an equal amount of time.

To recoup some of the significant cost of the electric power consumed by the computer hardware in such mining operations, the heat energy generated (produced) by the computer hardware used in the mining operation could be recovered and collected so that it may be used, for example, in heating homes, swimming pools, green houses, etc. However, such use of the collected heat energy may require specialized equipment which could collect the heat energy from the mining hardware and transfer it to the point where the heat energy is consumed.

Alternatively, and according to embodiments of the method and system of the present invention, the heat energy generated by the computer hardware in the mining operation, could instead be used in for cooling applications, such air conditioning, food preservation, other types of refrigeration, etc. In embodiments of the method and system of the present invention, the heat energy generated by the computer hardware in the mining operation is recovered and then that recovered heat energy is utilized (e.g., transferred) to volatilize a refrigerant for use in cooling operations such as such as those described above. The cooling produced by this method and system can thus compensate for the electric energy consumption cost of the computer hardware used in the mining operation supporting the blockchain related cryptocurrency mining operations involved in bitcoin networks.

General Operation of Absorption Cooling Module. In embodiments of the method and system of the present invention, the computer hardware used in the mining operation employs an absorption cooling module to provide, for example, a closed continuous cooling cycle. Referring to FIG. 1, such a system is shown schematically, indicated generally as 100, with the absorption cooling module being indicated generally as 104. Heat energy ($Q_G$) generated by computer hardware 108 is transferred, as indicated by arrow 112, to generator 116 containing an absorption coolant fluid in the form of a fluid (e.g., liquid) refrigerant-absorbent mixture.

As further shown in FIG. 1, the heat energy ($Q_G$) 112 transferred from computer hardware 108 to generator 116 causes the refrigerant present in the fluid refrigerant-absorbent mixture to form refrigerant vapors which are then transferred, as indicated by arrow 120, to condenser 124. In condenser 124, some of the heat energy ($Q_C$) is released, as indicated by arrow 128, from the refrigerant vapors, thus converting those refrigerant vapors back into a liquid refrigerant. The liquid refrigerant from condenser 124, as indicated by arrow 128, then passes, as indicated by arrow 132, through expansion valve 136 and, as indicated by arrow 140, into an evaporator 144. Evaporator 144 vaporizes the refrigerant which absorbs the heat energy ($Q_E$), as indicated by arrow 148, from the environment, thus producing the cooling effect and forming refrigerant vapors. The refrigerant vapors from evaporator 144 enter, as indicated by arrow 152, absorber 156 and combine with the absorbent in the refrigerant-depleted fluid refrigerant-absorbent mixture, as indicated by arrow 160. (This refrigerant-depleted fluid refrigerant-absorbent mixture 160 is what remains after the formation of refrigerant vapors (per arrow 120) in generator 116). When the refrigerant vapors combine with the absorbent in the depleted fluid refrigerant-absorbent mixture 160, heat energy ($Q_A$), as indicated by arrow 164, is released, and a refrigerant-enriched fluid refrigerant-absorbent mixture is formed in absorber 156. This refrigerant-enriched fluid refrigerant-absorbent mixture from absorber 156 is then returned, as indicated by arrow 168, to generator 116.

System 100 involving absorption cooling module 104 described above could be configured into a variety of ways depending upon the cooling application involved or desired. For example, the cooling effect produced by absorption cooling module 104 could be utilized for food storage. In this case, the coils of evaporator 144 may be mounted on the freezer chambers. Alternatively, absorption cooling module 104 may be used for cooling the air inside a building for an air conditioning effect. In this situation, evaporator 144 may be equipped with an appropriate heat exchanger and include duct work for circulating the cooled air inside the building.

As described above, the fluid refrigerant-absorbent mixture in generator 116 comprises a mixture of a refrigerant and an absorbent. (As described below with respect to ammonia-water absorption refrigerator module 204, the fluid refrigerant-absorbent mixture may further comprise a capping gas.) The refrigerant is essentially the active ingredient that achieves the cooling effect. Suitable fluid refrigerant-absorbent mixtures for use in generator 116 usually satisfy the following requirements: (a) have a relatively high heat of vaporization as well as a relatively high concentration of the refrigerant to maximize the cooling benefit (i.e., the cooling effect of the cooling module provided per unit of mass of the refrigerant-absorbent mixture used) in the fluid refrigerant-absorbent mixture; (b) have a relatively high thermal conductivity in units of watts per meter-Kelvin (W/m K) to provide sufficient heat transfer and an appropriate viscosity; and (c) are desirably non-corrosive to the various components of absorption cooling module 104.

The absorbent (which may be a compound, composition, etc.) mixed with the refrigerant to form the fluid refrigerant-absorbent mixture elevates the boiling (volatilization) temperature of the refrigerant present in the solution compared to the refrigerant alone. These conditions may be achieved if the refrigerant and the absorbent have an affinity to each other, such as, for example, by forming a complex or compound, and the formation of this complex or compound is accompanied by the release of heat energy ($Q_A$) 164, as described above. In other words, when the refrigerant combines with the absorbent, there is a non-zero enthalpy of formation of this compound or complex achieved, per the following equation (1):

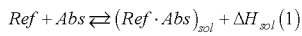

$$Ref + Abs \rightleftarrows (Ref \cdot Abs)_{sol} + \Delta H_{sol} \quad (1)$$

wherein in equation 1 above, Ref refers to the refrigerant, Abs refers to the absorbent, (Ref Abs)$_{sol}$ refers to the complex or compound formed from combining the refrigerant and absorbent and $\Delta H_{sol}$ is the enthalpy of the complex or compound formed. As indicated in equation (1) above, this reaction is normally reversible, i.e., when heat energy is applied to the fluid refrigerant-absorbent mixture, this compound or complex should split up into the absorbent and the refrigerant.

Embodiments of absorption cooling module 104 may be in the form of an ammonia-water absorption refrigerator module or an absorption immersion cooling module, as described below.

Figure 2:
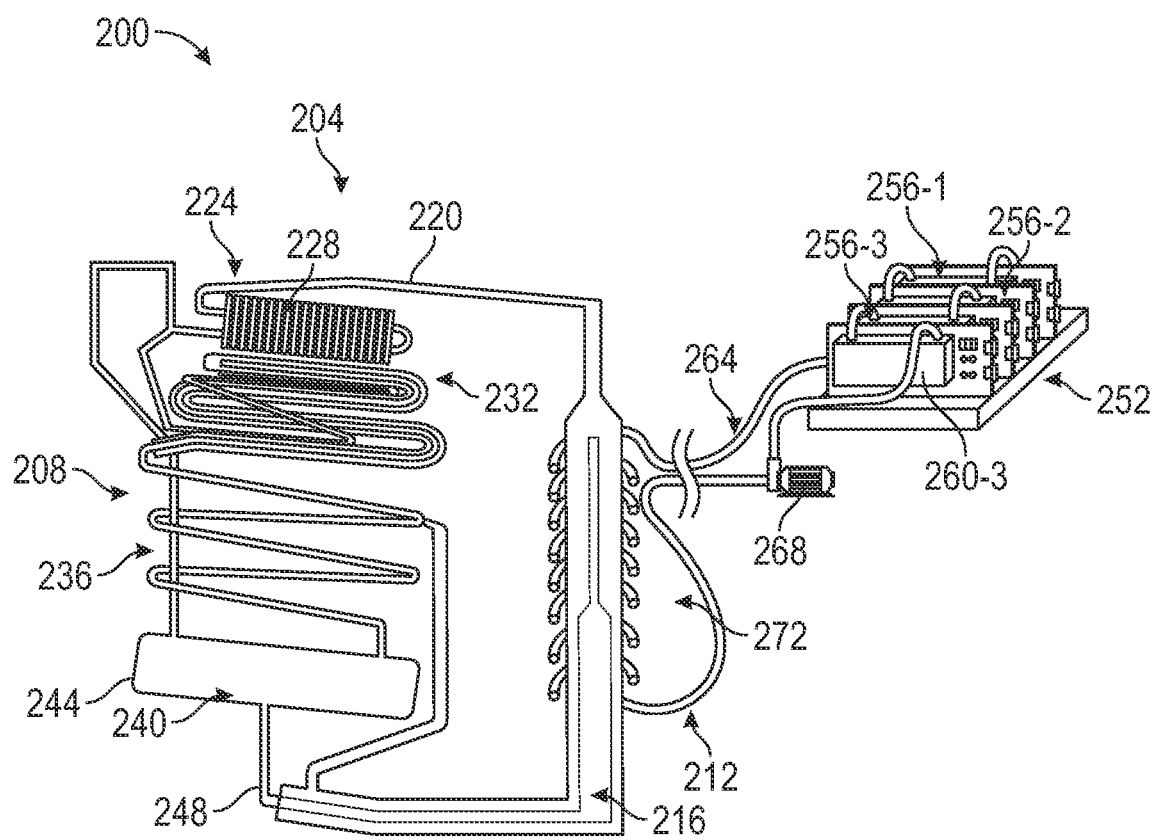
FIG. 2 schematically illustrates an embodiment of the method and system of the present invention wherein the absorption cooling module is an ammonia-water absorption refrigerator module.

Ammonia-Water Absorption Refrigerator Modules. In one embodiment of absorption cooling module 104 used in the method and system of the present invention, the heat energy produced by the computer hardware used in the mining operation may be used to power an ammonia-water absorption refrigerator module. In this embodiment, absorption cooling module 104 uses ammonia gas as the refrigerant. Referring to FIG. 2, a system, indicated generally as 200, is provided with an ammonia-water absorption refrigerator module, indicated generally as 204. As shown in FIG. 2, absorption refrigerator module 204 includes a refrigerator indicated generally as 208. A generator 212 contains a mixture of ammonia as the refrigerant and water as the absorbent to provide the fluid refrigerant-absorbent mixture, indicated generally as 216. When heat energy is supplied to generator 212, the ammonia gas evaporates (vaporizes) from the fluid refrigerant-absorbent mixture, passing through a water separator 220, and entering the condenser, indicated generally as 224, which is equipped with a heat exchanger 228. In condenser 224, the vaporized ammonia gas is converted into a liquid form and enters the evaporator, indicated generally as 232. In evaporator 232, the liquid ammonia is mixed with hydrogen gas which functions as a "capping gas", i.e. an inert gas that allows for equalization of the pressure in absorption refrigerator module 204 without using an expansion valve. The presence of the hydrogen gas in the liquid ammonia causes a drop in the partial vapor pressure of the ammonia such that evaporation (vaporization) of the ammonia imparts a cooling effect. The vaporized ammonia is then mixed with the depleted ammonia-absorbent solution in an absorber, indicated generally by 236, to provide an ammonia-enriched fluid refrigerant-absorbent mixture. The ammonia-enriched fluid refrigerant-absorbent mixture is collected, as indicated generally by 240, in an absorber vessel 244. The ammonia-enriched fluid refrigerant-absorbent mixture 240 in absorber vessel 244 is then returned via a return line 248 to generator 212 to provide fluid refrigerant-absorbent mixture 216, thus closing the loop for absorption refrigerator module 204.

As further shown in FIG. 2, the heat energy provided to absorption refrigerator module 204 is obtained from computer hardware, indicated generally as 252, from a blockchain mining operation. In one embodiment of system 200, circuit boards such as printed circuit boards (PCBs), three of which are shown and are indicated as 256-1 through 256-3, of computer hardware 252 may be mounted directly to generator 212. Provisions may be made to ensure that there is proper thermal contact between the computer chips mounted on PCBs 256-1 through 256-3 and the body of generator 212. The rate of the heat energy generation by PCBs 256-1 through 256-3 may also be controlled by adjusting the computational speed.

As shown in FIG. 2, in one embodiment of absorption refrigerator module 204, the heat energy generated by PCBs 256-1 through 256-3 of computer hardware 252 from the mining operation may be transferred to generator 212 by means of a circulating heat transfer fluid. In this embodiment, the computer chips of PCBs 256-1 through 256-3 may be equipped with heat sinks 260-1 through 260-3. Heat sinks 260-1 through 260-3 may be made of, for example, copper or aluminum alloy. Heat sinks 260-1 through 260-3 are shown in FIG. 2 as being interconnected, for example, by tubing, indicated generally as 264. Heat transfer fluid (not shown) passes through the internal channels (not shown) formed in heat sinks 260-1 through 260-3. If the heat transfer fluid is present for sufficient time inside heat sinks 260-1 through 260-3, the temperature of the heat transfer fluid within will be at the equilibrium with that of heat sinks 260-1 through 260-3. The heated fluid within heat sinks 260-1 through 260-3 is then circulated by a fluid pump 268, and is then passed through a heat exchanger, indicated generally as 272, mounted on generator 212.-

In an alternative embodiment of absorption cooling module 204, heat generated by PCBs 256-1 through 256-3 of computer hardware 252 of the mining operation may, instead, be transferred to the generator 212 through the use of one or more thermally conductive foils made from graphene nanoplatelets which are connected from PCBs 256-1 through 256-3 to the generator. The graphene foil may be manufactured, for example, by rolling out graphene nanoplatelets as relatively thin sheets having a thickness in the range of from about 10 to about 50 μm. Such graphene foil may have a lateral thermal conductivity in the range of from about 1300 to about 1500 watts per meter-Kelvin (W/m·K). The graphene foil may be mounted on the computer chips for example with thermally conductive adhesive.

Absorption Immersion Cooling Module. In another embodiment, absorption cooling module 100 may be in the form of an absorption immersion cooling module to transfer heat energy from the computer hardware used in the mining operation. See U.S. Pat. No. 4,704,658 (Yokouchi et al.) issued Nov. 3, 1987, the entire disclosure and contents of which are herein incorporated by reference, which discloses an immersion cooling module for semiconductor devices. In an absorption immersion cooling module, the computer hardware used in the mining operation is placed within a vessel filled with an absorption coolant fluid. The components (e.g., PCBs) of the computer hardware from mining operation are mounted in vessel and are immersed in the coolant fluid. The vessel is also equipped with a condenser. The heat energy generated by these components of the computer hardware immersed in the coolant fluid cause boiling (vaporization) of the refrigerant present in the coolant fluid. The condenser, which may also include a heat sink with a fin stock that is cooled by, for example, water supplied from outside the condenser, condenses the refrigerant vapors of the coolant fluid and converts those vapors back into a liquid form which are then returned to the coolant fluid in the vessel.

Figure 3:
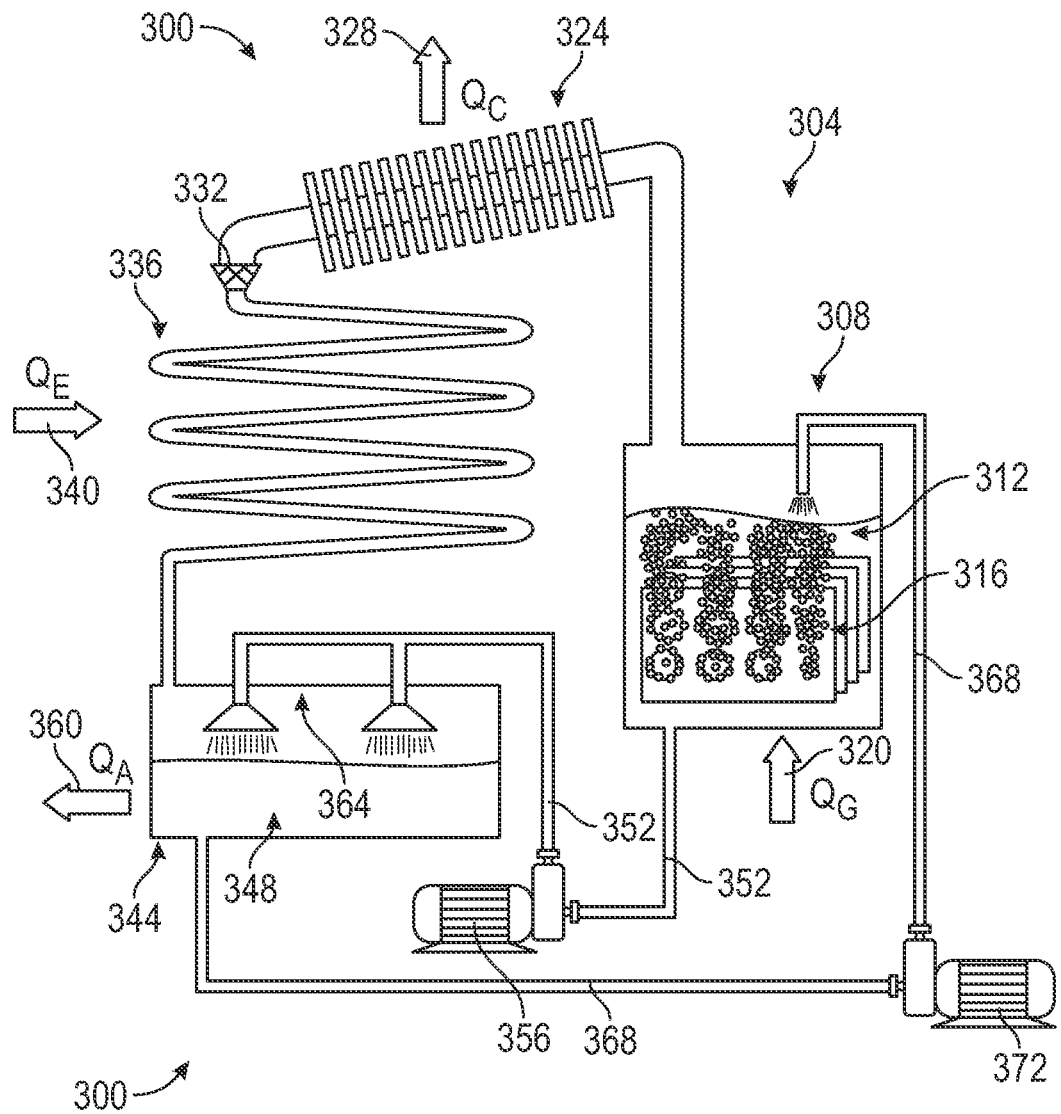
FIG. 3 schematically illustrates an embodiment of the method and system of the present invention wherein the absorption cooling module is an absorption immersion cooling module.

One embodiment of such a system using an absorption immersion cooling module according to the present invention is shown in FIG. 3. Referring to FIG. 3, a system, indicated generally as 300, is provided with an absorption immersion cooling module, indicated generally as 304. In absorption immersion cooling module 304, the immersion tank, indicated generally as 308, is filled with a fluid refrigerant-absorbent mixture, indicated by arrow 312, which comprises a mixture of the refrigerant and absorbent. The refrigerant may any of a number of immersion dielectric refrigerants, such as fluorocarbons.

Components of the computer hardware used in the mining operation, indicated generally as 316, are mounted within (inside) tank 308 and are immersed in the fluid refrigerant-absorbent mixture 312. Heat energy ($Q_G$), indicated by arrow 320, generated by components 316 of the computer hardware causes evaporation (vaporization) of the refrigerant in the fluid refrigerant-absorbent mixture 312 in tank 308. Tank 308 may be hermetically sealed such that the refrigerant vapors generated in tank 308 may be collected and transmitted to the condenser, as indicated generally as 324. In condenser 324, the refrigerant vapors are converted back into a liquid refrigerant. The heat energy ($Q_C$), indicated by arrow 328 released during this conversion of refrigerant vapors back to a liquid refrigerant may be released into the outside environment, especially when condenser 324 is mounted outside of the building where the mining operation takes place.

The liquid refrigerant formed in condenser 324 passes through an expansion valve 332 and into an evaporator, indicated generally as 336. Inside evaporator 336, evaporation (vaporization) of the liquid refrigerant again occurs; thus causing a cooling effect. Heat energy ($Q_E$), indicated by arrow 340, required for such evaporation of the liquid refrigerant is thus released and removed from the environment. For practical reasons, evaporator 336 may be equipped with heat exchangers, ventilation ducts, blower fans, etc., or may be mounted onto a refrigeration chamber depending upon the cooling effect to be achieved. In an alternative embodiment of an absorption immersion cooling module 304, the refrigerant which evaporates (vaporizes) inside evaporator 336 may be mixed with a capping gas, such as hydrogen, helium, etc. Mixing the refrigerant with this capping gas causes a drop in the partial pressure of the refrigerant vapors, thus imparting a more rapid evaporation (vaporization) of the liquid refrigerant and thus a faster cooling effect. The use of the capping gas also equalizes the total pressure inside absorption immersion cooling module 304.

The refrigerant vapors from evaporator 336 are then admitted to an absorber, indicated generally as 344, wherein the refrigerant vapors are mixed with the depleted fluid refrigerant-absorbent mixture, indicated generally as 348, which is provided to absorber 344, via line 352, by a first (electric) pump 356, from tank 308 to form a refrigerant-enriched fluid refrigerant-absorbent mixture. A sprayer assembly, indicated generally as 364, may also be installed in absorber 344 to further enhance the absorption of the refrigerant vapors by the depleted fluid refrigerant-absorbent mixture in forming the refrigerant-enriched fluid refrigerant-absorbent mixture. In absorber 344, the refrigerant absorbed by the depleted fluid refrigerant-absorbent mixture in forming the refrigerant-enriched fluid refrigerant-absorbent mixture is accompanied by a release of heat energy ($Q_A$), indicated by arrow 360. The refrigerant-enriched fluid refrigerant-absorbent mixture may then be transferred from absorber 344 via return line 368 by second (electric) pump 372.

Several suitable immersion refrigerants for use in absorption immersion cooling module 304 (under the Novec tradename from 3M) and their properties are show in the following Table 1:

TABLE 1

| Name | Trade Name | CAS number | Boiling Point (°C) | FIG. |
|---|---|---|---|---|
| 1-Methoxyheptafluoropropane | Novec 7000 | 375-03-1 | 34 | 401 |
| Perfluoro(2-methyl-3-pentanone) | Novec 649 | 756-13-8 | 49 | 402 |
| Nonafluoromethoxybutane | Novec 7100 | 163702-08-7 | 61 | 403 |
| Tetradecafluoro-2-methylhexan-3-one | Novec 774 | 7379-12-6 | 74 | - |
| 1,1,1,2,2,3,4,5,5,5-Decafluoro-3-methoxy-4-(trifluoromethyl)pentane | Novec 7300 | 132182-92-4 | 98 | 405 |
| 2-(Trifluoromethyl)-3-ethoxydodecafluorohexane | Novec 7500 | 297730-93-9 | 128 | 406 |

As mentioned above, the absorbent used in any of the absorption cooling modules shown in FIGS. 1 through 3 need to satisfy several requirements: (a) have a high vapor pressure; (b) be a dielectric; and (c) when mixed with the refrigerant, form a solution accompanied by a release of heat energy. There several potential compounds or compositions which may be used as absorbents. For example, certain fluoride salts may be used as an absorbent in the absorption immersion cooling module 304 described herein. See Evans et al., "Formation of Adducts Between Fluorinated Ketones and Metal Fluorides," *The Journal of Organic Chemistry*, Vol. 33(5), (1968), pp. 1837-1839, the entire disclosure and contents of which are herein incorporated by reference, which discloses certain fluoride salts which can form an adduct with certain fluorinated ketones, as well as the heat energy which can generated by such adduct formation. An example of a fluoride salt suitable for use herein as an absorbent for fluorocarbon refrigerants is cesium fluoride. Cesium fluoride has a low lattice energy and may form an adduct with fluorinated ketones.

Yet another metal salt for suitable use herein as an absorbent for fluorocarbon refrigerants is lithium bromide. In utilizing such metal salts such as lithium bromide as absorbents for fluorocarbon refrigerants used in fluid refrigerant-absorbent mixture in absorption immersion cooling modules 304s, care may need to be taken with such metal salts as fluid refrigerant-absorbent mixtures containing same may cause the coolant fluid to become corrosive and to cause degradation of the computer hardware used in the mining operation.

Additional suitable absorbents for use herein include DMCA (N,N-dimethylacetamide), NMP (N-methyl-2-pyrrolidone), DMEU (dimethyl-ethyleneurea), TEGDME (tetraethylene glycol dimethyl ether), and MCL (N-methyl ε-caprolactum). See Sun et al., "A Review of Working Fluids of Absorption Cycles," *Renewable and Sustainable Energy Reviews*, Vol. 16 (2012), pp. 1899-1906. As described in the Sun et al. article, these compounds may also be successfully employed as absorbents with halogenated hydrocarbons. Accordingly, these compounds may be used as absorbents with the above-mentioned immersion fluids employed as refrigerants.

Properly functionalized graphene oxide nanoplatelets may also serve as an absorbent. Functionalized graphene oxide suitable for use herein as an absorbent comprises a hydrophilic molecule having polar oxygen-containing functional groups (e.g., carboxyl-, hydroxyl-, carbonyl-, epoxy-, etc.). These graphene oxide nanoplatelets have a relatively large specific surface area (e.g., a few hundred m²/g.), which is an important property for use as a solid absorbent. Because these graphene oxide nanoplatelets are heavily functionalized, they are also not electrically conductive, i.e., are dielectric. Appropriate chemical modification of these functionalized graphene oxide nanoplatelets may also significantly increase their dispersibility in non-polar organic solvents, including the perfluorinated refrigerants described above. One such chemical modification of the graphene oxide surface may be by including, for example, one or more alkyl substituent groups having a chain length of from 7 to 14 carbon atoms. By employing such chemical modification, the functionalized polar groups of the modified graphene oxide nanoplatelets may adhere more effectively to the molecules of the immersion refrigerant by specific hydrogen bonding and non-specific electrostatic interaction to form a complex having a negative enthalpy. Such a modified functionalized graphene oxide nanoplatelets may raise the boiling (vaporization) point of the immersion refrigerant, thereby satisfying the requirements for an absorbent. Thus, such modified functionalized graphene oxide nanoplatelets may provide an effective absorbent when combined with the refrigerant in a refrigerant solution for absorption immersion cooling module 304, as described above.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

In addition, the purpose of the Abstract of the Disclosure in this application is to enable the U.S. Patent and Trademark Office, as well as the public generally, including any scientists, engineers and practitioners in the art who may not be familiar with patent or other legal terms or phraseology to determine the what the technical disclosure of the application describes. Accordingly, while the Abstract of the Disclosure may be used to provide enablement for the following claims, it is not intended to be limiting as to the scope of those claims in any way.

Finally, it is the applicant's intent that only claims which include the express language "means for" or "step for" be interpreted under 35 U.S.C. § 112, paragraph 6. Accordingly, claims that do not expressly include the phrase "means for" or "step for" are not to be interpreted as being within the purview of 35 U.S.C. § 112, paragraph 6, or to be construed as being subject to any case law interpreting the meaning of these phrases.

What is claimed is:

1. A method for recovering heat energy from computer hardware in a blockchain mining operation, the method comprising the steps of:
    providing heat energy generated by the computer hardware in the blockchain mining operation; and
    utilizing the heat energy in an absorption immersion cooling module to generate a cooling effect with a coolant fluid comprising a liquid refrigerant-absorbent mixture, wherein the absorption immersion cooling module comprises:
        a tank filled with the liquid refrigerant-absorbent mixture,
        wherein the computer hardware is placed in the tank,
        wherein the computer hardware has at least one component,
        wherein at least one of the at least one computer hardware component is fully submerged in the liquid refrigerant-absorbent mixture,
        wherein the heat energy generated by the at least one computer hardware component causes evaporation of the refrigerant in the liquid refrigerant-absorption mixture in the tank creating refrigerant vapor,
        wherein the absorption immersion cooling module further comprises a condenser in fluid communication with an upper portion of the tank,
        wherein the condenser converts the refrigerant vapors into liquid refrigerant,
        wherein the absorption immersion cooling module further comprises an evaporator in fluid communication with the condenser,
        wherein the evaporator evaporates the liquid refrigerant into refrigerant vapor to cause cooling,
        wherein the absorption immersion cooling module further comprises an absorber in fluid communication with the evaporator,
        wherein the refrigerant vapors from the evaporator is mixed with depleted liquid refrigerant-absorption mixture in the absorber to enrich the depleted liquid refrigerant-absorption mixture with the refrigerant to reform the liquid refrigerant-absorbent mixture,
        wherein the absorption immersion cooling module further comprises a pump in fluid communication with a lower portion of the absorber and with the tank, and
        wherein the pump causes the refrigerant-absorbent mixture to be returned to the tank.

2. The method of claim 1, wherein the blockchain mining operation is a cryptocurrency mining operation.

3. The method of claim 1, wherein the blockchain mining operation comprises a mining farm.

4. The method of claim 1, wherein the absorption immersion cooling module further comprises an expansion valve, wherein the expansion valve is in fluid communication with each of the condenser and the evaporator to regulate pressure.

5. The method of claim 1, wherein the absorption immersion cooling module further comprises a sprayer pump in fluid communication with a lower portion of the tank, and at least one sprayer positioned in an upper portion of the absorber.

6. The method of claim 5, wherein the at least one sprayer is in fluid communication with the sprayer pump.

7. The method of claim 5, wherein the sprayer pump causes the refrigerant-absorbent mixture in the tank to spray from the at least one sprayer into the absorber to increase the absorption of the refrigerant vapor by the depleted liquid refrigerant-absorption mixture.

8. The method of claim 1, wherein the wherein the absorption immersion cooling module further comprises a capping gas, and wherein the capping gas is carried by the evaporator and is mixed with the refrigerant vapor to encourage evaporation of the liquid refrigerant in the evaporator.

9. The method of claim 1, wherein the absorption immersion cooling module utilizes the liquid refrigerant-absorbent mixture comprising one or more dielectric fluorocarbons as the refrigerant, and one or more of: cesium fluoride; lithium bromide; N,N-dimethylacetamide; N-methyl-2-pyrrolidone; dimethyl-ethylene urea; tetraethylene glycol dimethyl ether; N-methyl Ecaprolactum; or functionalized graphene oxide nanoplatelets, as the absorbent.

10. The method of claim 9, wherein the absorbent comprises cesium fluoride.

11. The method of claim 9, wherein the absorbent comprises functionalized graphene oxide nanoplatelets, wherein the functionalized graphene oxide nanoplatelets have one or more polar oxygen-containing functional groups which are one or more of: carboxyl; hydroxyl; carbonyl; or epoxy, and wherein the functionalized graphene oxide nanoplatelets are modified to have one or more alkyl substituent groups having a chain length of from 7 to 14 carbon atoms.

12. The method of claim 11, wherein the at least one computer hardware components comprises at least one printed circuit board that is immersed in the liquid refrigerant-absorbent mixture.

13. A system for recovering heat energy from computer hardware in blockchain mining operations, the system comprising:
    a heat energy generation module comprising the computer hardware which generates the heat energy; and
    an absorption immersion cooling module which utilizes the heat energy from the heat energy generation module to generate a cooling effect with a coolant fluid comprising a liquid refrigerant-absorbent mixture, wherein the absorption cooling module comprises:
        a tank filled with the liquid refrigerant-absorbent mixture;
    wherein the computer hardware is carried by the tank;
    wherein at least a portion of the computer hardware is submerged in the liquid refrigerant-absorbent mixture;
    wherein the heat energy generated by the computer hardware causes evaporation of the refrigerant in the liquid refrigerant-absorption mixture in the tank creating refrigerant vapor;
    wherein the absorption immersion cooling module further comprises a condenser in fluid communication with an upper portion of the tank;
    wherein the condenser is adapted to convert the refrigerant vapors into liquid refrigerant;
    wherein the absorption immersion cooling module further comprises an evaporator in fluid communication with the condenser;
    wherein the evaporator is adapted to evaporate the liquid refrigerant into refrigerant vapor, to cause cooling;
    wherein the absorption immersion cooling module further comprises an absorber in fluid communication with the evaporator;
    wherein the absorber is adapted to mix the refrigerant vapors from the evaporator with depleted liquid refrigerant-absorption mixture in the absorber to enrich the depleted liquid refrigerant-absorption mixture with the refrigerant to reform the liquid refrigerant-absorbent mixture;
    wherein the absorption immersion cooling module further comprises at least one sprayer and a sprayer pump;
    wherein the at least one sprayer is positioned in an upper portion of the absorber and the sprayer pump is in fluid communication with a lower portion of the tank and with the at least one sprayer;
    wherein the sprayer pump is adapted to cause the refrigerant-absorbent mixture in the tank to spray from the at least one sprayer into the absorber to increase the absorption of the refrigerant vapors by the depleted liquid refrigerant-absorption mixture;
    wherein the absorption immersion cooling module further comprises a pump in fluid communication with a lower portion of the absorber and with the tank; and
    wherein the pump is adapted to cause the refrigerant-absorbent mixture to be returned to the tank.

14. The system of claim 13, wherein the blockchain mining operation is a cryptocurrency mining operation.

15. The system of claim 13, wherein the blockchain mining operation comprises a mining farm.

16. The system of claim 13, wherein the absorption immersion cooling module further comprises an expansion valve, wherein the expansion valve is in fluid communication with each of the condenser and the evaporator to regulate pressure.

17. The system of claim 13, wherein the computer hardware comprises at least one printed circuit board that has at least a portion thereof immersed in the liquid refrigerant-absorbent mixture.

18. The system of claim 13, wherein the absorption immersion cooling module further comprises a capping gas, and wherein the capping gas is carried by the evaporator and is mixed with the refrigerant vapor to encourage evaporation of the liquid refrigerant in the evaporator.

19. The system of claim 13, wherein the absorption immersion cooling module utilizes the liquid refrigerant-absorbent mixture comprising one or more dielectric fluorocarbons as the refrigerant, and one or more of: cesium fluoride; lithium bromide; N,N-dimethylacetamide; N-methyl-2-pyrrolidone; dimethyl-ethylene urea; tetraethylene glycol dimethyl ether (TEGDME); Nmethyl Ecaprolactum; or functionalized graphene oxide nanoplatelets, as the absorbent.

20. The system of claim 19, wherein the absorbent comprises cesium fluoride.

21. The system of claim 19, wherein the dielectric fluorocarbons comprise one or more of: 1, 1, 1,3,3-pentafluoropropane; 1-methoxyheptafluoropropane;
    perfluoro(2-methyl-3-pentanone; nonafluoromethoxybutane; 1, 1, 1,2,2,3, 4,5,5,5-decafluoro-3-methoxy-4-(trifl uoromethyl )pentane; or 2-(trifluoromethyl)-3-ethoxydodecafluorohexane.

22. The system of claim 19, wherein the absorbent comprises functionalized graphene oxide nanoplatelets, wherein the functionalized graphene oxide nanoplatelets have one or more polar oxygen-containing functional groups which are one or more of: carboxyl; hydroxyl; carbonyl; or epoxy, and wherein the functionalized graphene oxide nanoplatelets are modified to have one or more alkyl substituent groups having a chain length of from 7 to 14 carbon atoms.

* * * * *